United States Patent [19]

Platzer

[11] Patent Number: 5,094,931

[45] Date of Patent: Mar. 10, 1992

[54] IMAGE TRANSFER TO DIVERSE PAPER STOCKS

[75] Inventor: Stephan J. W. Platzer, Eltville, Fed. Rep. of Germany

[73] Assignee: Hoechst Celanese Corporation, Somerville, N.J.

[21] Appl. No.: 513,016

[22] Filed: Apr. 23, 1990

Related U.S. Application Data

[63] Continuation of Ser. No. 328,729, Mar. 23, 1989, abandoned, which is a continuation of Ser. No. 38,739, Apr. 15, 1987, abandoned.

[51] Int. Cl.⁵ .................... G03C 11/12; G03C 1/90
[52] U.S. Cl. .................... 430/143; 430/257; 430/258; 430/262; 430/263
[58] Field of Search ........... 430/287, 258, 283, 143, 430/293, 294, 950, 961, 47, 257

[56] References Cited

U.S. PATENT DOCUMENTS

| | | | |
|---|---|---|---|
| 2,528,395 | 10/1950 | Slifkin | 430/160 |
| 3,642,474 | 5/1969 | Verelst et al. | 96/30 |
| 3,671,236 | 6/1972 | Van Beusekom | 430/257 |
| 3,721,557 | 3/1973 | Inoue | 430/166 |
| 3,775,113 | 11/1973 | Bonham et al. | 96/28 |
| 4,247,619 | 1/1981 | Cohen et al. | 430/253 |
| 4,262,071 | 4/1981 | Larson | 430/11 |
| 4,262,071 | 4/1981 | Larson | 430/11 |
| 4,262,079 | 4/1981 | Steelman et al. | 430/253 |
| 4,262,079 | 4/1981 | Steelman et al. | 430/253 |
| 4,304,836 | 12/1981 | Cheema | 430/257 |
| 4,376,158 | 3/1983 | Spechler | 430/291 |
| 4,376,158 | 3/1983 | Spechler | 430/291 |
| 4,376,159 | 3/1983 | Spechler | 430/293 |
| 4,376,159 | 3/1983 | Spechler | 430/293 |
| 4,482,625 | 11/1984 | Namiki et al. | 430/143 |
| 4,650,738 | 3/1987 | Platzer et al. | 430/257 |
| 4,650,738 | 3/1987 | Platzer et al. | 430/259 |
| 4,659,642 | 4/1987 | Platzer et al. | 430/257 |
| 4,659,642 | 4/1987 | Platzer et al. | 430/257 |
| 4,686,163 | 8/1987 | Ng et al. | 430/47 |
| 4,719,169 | 1/1988 | Platzer et al. | 430/143 |
| 4,766,053 | 2/1986 | Shinozaki et al. | 430/257 |

FOREIGN PATENT DOCUMENTS

| | | | |
|---|---|---|---|
| 115899 | 8/1984 | European Pat. Off. | 430/143 |
| 3605199A1 | 8/1986 | Fed. Rep. of Germany . | |
| 2008575 | 1/1970 | France . | |

*Primary Examiner*—Richard L. Schilling
*Attorney, Agent, or Firm*—Richard S. Roberts

[57] ABSTRACT

The invention provides a method for protecting an image which comprises providing a multilayered colored image on a permanent receiver which may be any of a wide range of materials. A photosensitive element on a substrate is laminated to a temporary element and exposed with substrate removal before development. After development, the steps are repeated with another color. A protective element is laminated to the colored image. After removal of the support of the temporary element, the colored image with protective element is laminated to a permanent receiver.

20 Claims, No Drawings

IMAGE TRANSFER TO DIVERSE PAPER STOCKS

This is a continuation of co-pending application Ser. No. 07/328,729 filed on Mar. 13, 1989, now abandoned which is a continuation of Ser. No. 07/038,739 filed on Apr. 15, 1987, now abandoned.

BACKGROUND OF THE INVENTION

In the graphic arts, it is desirable to produce a color proof to assist a printer in correcting a set of photomasks which will be used in exposing printing plates. The proof should reproduce the color quality that will be obtained during the printing process. The proof must be a consistent duplicate of the desired half-tone or line image, and should neither gain nor lose color. Visual examination of a color proof should reveal the following characteristics:

1. Any defects on the photomask.
2. The best color rendition to be expected from press printing of the material.
3. The correct gradation of all colors and whether grays are neutral.
4. The need, if any, for subduing any of the colors and/or giving directions for altering the film photomask before making the printing plates.

Color proofing sheets for multicolored printing have heretofore been made by using a printing press proof which requires taking all the steps necessary for actual multicolor printing. Such a conventional method of color proofing has been costly and time consuming. Color proofing methods have therefore been developed to simulate the quality of press proofs.

In the surprint type of color proofing method, a color proofing sheet is prepared by successively producing images of different colors from different color separation films onto a single receptor sheet. This is done by utilizing a single opaque support and by applying toners, photosensitive solutions or coatings of photosensitive materials of corresponding colors on the opaque support in succession. An example of this approach is described in U.S. Pat. No. 3,671,236. An advantage of the surprint type of color proof is that the color saturation is not influenced by superimposed plastic supports. This method more closely resembles the actual printing and eliminates the color distortion inherent in the overlay system.

Various processes for producing copies of an image embodying photopolymerization and thermal transfer techniques are known as shown in U.S. Pat. Nos. 3,060,023; 3,060,024; 3,060,025 3,481,736; and 3,607,264. In these processes, a photopolymerizable layer coated on a suitable support is imagewise exposed to a photographic transparency. The surface of the exposed layer is then pressed into contact with the image receptive surface of a separate element and at least one of the elements is heated to a temperature above the transfer temperature of the unexposed portions of the layer. The two elements are then separated, whereby the thermally transferable, unexposed, image areas of the composite transfer to the image receptive element. If the element is not precolored, the tacky unexposed image may now be selectively colored with a desired toner. The colored matter preferentially adheres to the clear unpolymerized material. U.S. Pat. No. 3,574,049 provides a transfer process for printing a design on a final support which comprises (a) printing a design onto a temporary support, (b) superimposing the temporary support and the final support, (c) applying heat and/or pressure to the superimposed structure formed in (b), and (d) separating the temporary support from the final support which retains the printed design. The affinity of the design for the temporary support is lower than its affinity for the final support.

In U.S. Pat. No. 3,721,557 a method of transferring colored images is claimed which provides a stripping layer coated between the photosensitive element and the support. When the photosensitive layer is exposed to actinic light and developed, the more soluble portions are selectively removed to produce a visible image. The image-carrying support is pressed against a suitable adhesive coated receptor member and, subsequently, the carrier support sheet is stripped to accomplish the transfer of the image. A fresh layer of adhesive is applied to the receptor for each subsequent transfer.

One problem encountered in the production of color proofing images is that the transfer of the layers may only be made onto a specially treated final receptor sheet. That is, a color proofing film manufacturer will typically provide the customer with a special white receptor sheet to which the images are laminated. This receptor sheet firmly retains the laminated layers and yet allows the removal of temporary supports to which the colored photosensitive layers were previously attached. Such special receptor sheets have been necessary since they are able to withstand the multiple developing and laminating treatments required for a multicolor proof image. The required use of such special receptor sheet is disadvantageous to the printer and his customer since such do not permit the viewing of the multicolored proof on the paper stock which will actually be used for printing. The instant invention seeks to solve this problem by producing a color proofing system which in its final form is adhered to virtually any desired paper stock. Not only are diverse paper stocks usable, but one can use both sides of the paper and several small sample proofs can be sequentially laminated onto a larger sheet for layout analysis.

SUMMARY OF THE INVENTION

The invention provides a method for forming a colored image which comprises:

A.) providing a photosensitive element which comprises, in order:
  a substrate having a release surface; and a photosensitive member directly attached to said release surface, which member comprises
  i) a colored, adherent, photosensitive layer, which layer comprises a light sensitive, positive working or negative working compound; a resinous binder and at least one colorant; and
  ii) an optional first colorless adhesive layer directly adhered to on said colored photosensitive layer, which adhesive layer has a softening point in the range of from about 60° C. to about 180° C.; and
  iii) an optional noncolored photosensitive or nonphotosensitive barrier layer coating between said colored photosensitive layer and said first adhesive layer said barrier layer being effective to prevent the intermingling of said colored photosensitive and optional first adhesive layers; and thereafter B.) providing a temporary element, which comprises a dimensionally heat stable support having a release surface on which release surface is applied an optional colorless adhesive, which adhesive layer has a softening point in the range of from about 60° C. to about 180° C., on which adhesive is optionally applied an antiblocking layer; said antiblocking layer comprising one or more organic polymers or copolymers, which antiblocking layer does not cohesively block at about 50° C. or less; and C.) either i) laminating said photosensitive member with heat and pressure to the optionally coated side of the temporary element; and removing said substrate from the photosensitive element by the application of peeling forces thus transferring the photosensitive member to the temporary element; and imagewise exposing said photosensitive layer to actinic radiation; or ii) imagewise exposing said photosensitive layer to actinic radiation; and laminating said photosensitive member with heat and pressure to the optionally coated side of the temporary element; and removing said substrate from the photosensitive element by the application of peeling forces thus transferring the photosensitive member to the temporary element; or iii) laminating said photosensitive member with heat and pressure to the optionally coated side of the temporary element; and imagewise exposing said photosensitive layer to actinic radiation; and removing said substrate from the photosensitive element by the application of peeling forces, thus transferring the photosensitive member to the temporary element; and D.) removing the nonimage areas of said photosensitive layer with a liquid developer, which removing is conducted at a temperature at which said adhesive layers are substantially nontacky, thereby providing a colored image; and E.) optionally repeating steps A-D by laminating another photosensitive member having a different colorant to the previous imaged layer; and F.) providing a protective element, which element comprises a dimensionally heat stable base having an optional release layer on which base or optional release layer is applied a second adhesive and another optional antiblocking layer between said base and said second adhesive; and G.) laminating said protective element to said colored image via said second adhesive; and H.) removing the support of the said temporary element thereby uncovering an adhesive layer; and laminating via said uncovered adhesive layer to a permanent support; and I.) optionally removing the base sheet of the protective element from said colored image on said permanent support.

From this discussion, it is obvious that the adhesive force of the photosensitive member to the temporary element is greater than the adhesive force of the photosensitive member to the substrate. Likewise the adhesion of the adhesive of the protective element to the image layers is greater than the adhesion of the photosensitive member to the support of the temporary element or of the optional adhesive of the temporary element to its support. Finally, if the base sheet from the protective element is to be removed, then the adhesion of the layers to the permanent support is greater than that of the base of the protective element to its adhesive or optionally to its antiblocking layer.

DETAILED DESCRIPTION OF THE PREFERRED EMBODIMENT

In carrying out the method of the invention, one employs a photosensitive element which broadly comprises a substrate having a colored photosensitive member thereon as hereinbefore described.

In the preferred embodiment, the substrate is composed of a dimensionally and chemically stable base material which does not significantly change its size, shape or chemical properties as the result of the heated lamination or other treatments which it must undergo. One preferred material is polyethylene terephthalate. In the usual case it has a thickness of from about 1 to about 10 mils, a more preferred thickness is from about 2-5 mils and most preferably from about 2-3 mils. Suitable films include polyesters, such as polyethylene terephthalate, for example, Hostaphan 3000, available from American Hoechst Corporation; Mylar D, available from DuPont; and Melinex grades 0, 052, 442, 516 and S, available from ICI. The substrate may be transparent or opaque, clear or colored. The surface of the substrate may be smooth or may be provided with a matte texture by various methods known in the art. Matte films include Melinex 377 and 470 from ICI. The substrate either inherently has a release surface or is provided with a release surface such as by the application of a polyvinyl alcohol coating.

Bonded to the release surface of the substrate is a colored photosensitive member having a photosensitive layer. The photosensitive layer broadly comprises a positive or negative working photosensitizer, a colorant, a binding resin, and other optional ingredients such as plasticizers, thermoplastic adhesives, acid stabilizers, surfactants, antistatic compositions, uv absorbers, dispersing agents and residual coating solvents.

The photosensitizer is preferably a light sensitive, polymeric diazonium salt, diazide, or photopolymerizable or photocrosslinkable composition as are well known in the art. The preferred diazide is the ester of bis-(3-benzoyl-4,5,6,trihydroxy phenyl) methane and 2-diazo-1-naphthol-5-sulfonic acid as taught in U.S. Pat. No. 4,407,426. Other suitable diazides are taught in U.S. Pat. No. 4,266,001; 3,106,365; 3,148,983; and 3,201,239. The most preferred photosensitizer is the polycondensation product of 3-methoxy-4-diazo-diphenyl amine sulfate and 4,4'-bis-methoxy methyl-diphenyl ether, precipitated as mesitylene sulfonate as taught in U.S. Pat. No. 3,849,392. Other suitable photosensitizers are taught in U.S. Pat. No. 4,436,804. The diazo compounds of choice are preferably soluble in organic solvents.

Suitable binding resins include polyvinyl acetals and styrene maleic anhydride copolymer half esters, diacids and mixtures. Such resins include Butvar B72, B76 and B90 and Scripset 540 and 550, respectively, all available from Monsanto. An important resin selection criterion is that it must be a good film former.

The colorants useful for the present invention include various classes of dyes and pigments. In the most preferred embodiment, pigments having an average particle size of about 1 micrometer or less are used.

Optional plasticizers which may be incorporated into the photosensitive layer include those of the phthalate and phosphate types. Preferred plasticizers include dibutyl phthalate and dimethyl phthalate. Polymeric plasticizers may also be used. Acid stabilizers include phosphoric acid and p-toluene sulfonic acid.

These ingredients may be blended with such compatible coating solvents as ethanol, methyl cellosolve, diacetone alcohol, gamma butyrolactone, propylene glycol monomethyl ether, and methyl ethyl ketone.

Optionally adhered to the surface of the photosensitive layer is a separate adhesive layer which adhesive layer has a softening point in the range of from about 60° C. to about 180° C.; and an optional barrier layer between said photosensitive layer and adhesive layer said barrier layer being effective to prevent the intermingling of said photosensitive and optional adhesive layers. Suitable barrier layers non-exclusively include coatings of polyvinyl chloride/vinyl acetate copolymer and polymethyl methacrylate at a coating thickness of from about 0.1 to 5.0 m.

This photosensitive element is then laminated via the adhesive power of the photosensitive layer or the adhesive layer to a developer resistant, dimensionally heat stable temporary element; imagewise exposed to actinic radiation and the substrate removed. The aforesaid lamination, exposure and substrate removal may be conducted in any convenient order. Lamination is conducted under suitable heat and pressure. Both the lamination and exposure methods are well known in the art.

The temporary element comprises another dimensionally heat stable support having a release surface on which release surface is applied another optional thermoplastic adhesive, on which adhesive is optionally applied an antiblocking layer, as described hereinafter.

The nonimage areas of the photosensitive layers are then removed with a liquid developer. Suitable developers for the photosensitive layer are also well known in the art depending upon the choice of photosensitizing agent. Such may include organic solvents; aqueous solutions of acids or bases; and aqueous solutions of mono-, di- and tri-sodium phosphates, and such sulfates as sodium tetradecyl sulfate.

The aforesaid steps are optionally repeated for each of several superimposed image colors. Usually four images are applied to the receiver sheet to give a full color composite.

According to the present invention, it is often desired to protect the aforesaid photographic image from scratches, dirt and the like due to handling and transportation. So a protective element is laminated with heat and pressure to the image layer on the temporary receiver sheet.

It is desirable to laminate with pressure to the image layer at a relatively low temperature, since excessive temperatures can distort and discolor the image. An additional objective is that the protective element be substantially nonblocking over extended storage periods.

In general, the protective element to be applied to the image comprises an adhesive layer which is on yet another dimensionally heat stable base having a release surface. In a preferred embodiment another optional antiblocking layer is disposed between the support and the adhesive layer. These may have been applied to the support by conventional coating or laminating techniques.

In this case, the composite of adhesive and antiblocking layers on the base of the protective element is laminated to the composite image layer. Subsequently the support of the temporary element is removed and the remaining part is laminated via the uncovered adhesive layer to a permanent support, for example, paper, coated paper, metals or any of the aforementioned polyesters films.

In the preferred embodiment, the support for the temporary element and base for the protective element may comprise any material which is dimensionally stable under laminating conditions. These include polyesters, particularly polyethylene terephthalate. The supports may be transparent or opaque, clear or colored.

The surface of the substrate, support or base may be smooth or may be provided with a matte texture by various methods known in the art. Smooth films include Melinex 516 from ICI. Matte films include Melinex 329, 377 and 470 from ICI. One can control the gloss of the final image by properly selecting the proper finish of the base of the protective element.

For a matte finish, a rough film layer is laminated to the final image under pressure and temperature. Then the film with the rough surface can be peeled off. The rough surface imparts a matte finish to the final image. The texture of the protected image layer can be further modified by subsequent laminations with a textured material which is removed after lamination. It can also be modified by subsequent treatment with solvents and/or particles which remove part of the protective layer.

The base of the protective element can have a release surface, that is, it can be capable of releasably holding the adhesive and optional antiblocking layer. This may be accomplished either by the support surface being inherently releasable, being rendered releasable by a suitable treatment or being provided with a release layer over the substrate surface. Such a release layer may comprise polyvinyl alcohol.

The support of the temporary element must have a release surface, that is, it must be capable of releasably holding the adhesive layer. This may be accomplished either by the support surface being inherently releasable or being rendered releasable by a suitable treatment. The temporary support can preferably consist of a dimensionally and chemically stable base with an adhesive layer. The adhesive layer is brought into contact with the colored element during lamination. The adhesive insures that the colored element makes good contact with the temporary support. The temporary support can also consist of a stable base with an adhesive layer and an antiblocking layer in contact with the adhesive layer. The antiblocking layer is laminated to the colored element. The antiblocking layer is used to prevent the first colored layer from adhering to the temporary support at room temperature before lamination of the first colored element. The antiblocking layer can also act as a flexible support for the colored layer(s) and for the permanent receiver.

The adhesive layers of the photosensitive, temporary, and protective elements preferably have a thickness of from about 0.5 to 30 um, more preferably from about 1 to 20 um, and most preferably from about 5 to 15 um. The major portion of the adhesive layer is preferably a thermoplastic polymer or mixture of thermoplastic polymers which is substantially nontacky at ordinary room temperatures. The polymers can be selected from thermoplastic polymers which have a glass transition temperature (Tg) preferably between about 20° C. and 80° C., more preferably between about 25° C. and 60° C. The thermoplastic polymers should form flexible films. The major portion of the adhesive layer is alternatively a thermosetting polymer or mixture of thermosetting polymers which is substantially nontacky at ordinary room temperatures. They should preferably be transparent and colorless. The adhesive layer can also contain plasticizers, UV absorbers, surfactants, antistatic compositions, monomers, oligomers, photoinitiators, optical brighteners and colorants. Examples of polymeric plasticizers non-exclusively include Resoflex R296, available from Cambridge Industries. Examples of suitable thermoplastic adhesive materials non-exclusively include polyvinyl acetals such as Butvar B79, available from Monsanto; polyvinyl acetates such as Mowilith 30, available from American Hoechst Corporation; polyvinyl acrylates such as Elvacite 2044, available from DuPont; polyvinyl chloride/polyvinyl acetate copolymers such as UCAR VMCA available from Union Carbide. Examples of suitable thermosetting adhesive materials non-exclusively include phenolic resins such as Alnoval PN430 commercially available from Hoechst and epoxy resins such as Polyset EPC 202 from Dynachem. Examples of suitable monomer include Sartomer 399 from Arco. Examples of suitable oligomer include Sartomer 3000 from Arco.

The antiblocking layers preferably have a thickness of from about 0.2 to about 50 um, more preferably from about 1 to about 10 um and most preferably from about 2 to about 3 um. The major portion of the antiblocking layer is an organic polymer or mixture of organic polymers. The ingredients in the antiblocking layer are selected so that the layer does not cohesively block at about 50° C. or less, preferably at about 70° C. or less. Standard methods are used to test for cohesive blocking, such as described in ASTM D1146.

The polymer(s) in the antiblocking layer can be selected from polymers which have a glass transition temperature preferably above about 60° C., more preferably above 70° C., most preferably above 100° C. The polymers in the antiblocking layer should form flexible films. They should preferably be transparent and colorless, but can also contain plasticizers, UV absorbers, surfactants, antistatic compositions, and colorants. Example of polymeric plasticizer include Carboset 525 from BF Goodrich.

Examples of antiblocking compounds include styrene maleic anhydride copolymers such as Scripset 540 available from Monsanto; polyvinyl acetals such as Butvar B90 from Monsanto; polyvinyl acrylates such as Elvacite 2008 available from DuPont; polyvinyl acetal/polyvinyl alcohol/polyvinyl acetate resins such as described in U.S. Patent application serial number 762,089 which is incorporated herein by reference; polyvinyl acetate/polyvinyl chloride copolymers such as Hostaflex CM 131 from American Hoechst Corporation.

Lamination may be conducted by putting the respective layers in contact to form a composite and then introducing the two materials into the nip of a pair of heated laminating rollers under suitable pressure. Suitable laminating temperatures usually range from about 60° C. to about 90° C., preferably about 75° C. to about 85° C. After lamination, the supports of the photosensitive, temporary, and protective elements which have a release surface can be peeled away, usually merely employing manual peeling forces. The following nonlimiting examples serve to illustrate the invention.

EXAMPLE 1

Photosensitive, transferable elements are made by coating the following photosensitive solutions onto a carrier base to the proper optical density and then by drying them at 70° C. The photosensitive layers are then overcoated with a thermally activated adhesive solution which is eventually dried. The formulations for the photosensitive solutions are:

|  | Cyan | Yellow | Magenta | Black |
|---|---|---|---|---|
| methyl cellosolve | 41.00 | 41.00 |  | 41.00 |
| methyl ethyl ketone | 41.00 | 40.90 | 10.51 | 41.00 |
| gamma-butryolactone | 10.00 | 10.00 |  | 10.00 |
| propylene glycol monomethyl ether |  |  | 30.69 |  |
| diacetone alcohol |  |  | 25.57 |  |
| tetrahydrofuran |  |  | 13.30 |  |
| ethanol |  |  | 14.32 |  |
| dimethyl phthalate | 0.75 | 0.75 |  | 0.80 |
| dibutyl phthalate | 0.25 | 0.25 |  | 0.28 |
| sulfuric acid |  |  |  | 0.07 |
| Scripset 540 | 3.33 |  | 2.15 | 0.93 |
| Scripset 550 | 1.17 | 0.70 |  |  |
| hydrolyzed Scripset 540 |  |  |  | 2.59 |
| polymeric diazonium salt | 1.33 | 1.40 | 1.54 | 2.16 |
| phthalo blue pigment | 1.17 |  | 0.01 |  |
| yellow pigment |  | 1.04 |  |  |
| rubine pigment |  |  | 0.89 |  |
| black pigment |  |  |  | 0.94 |
| optical density | 1.1 | 0.9 | 1.2 | 1.5 |

The polymerized diazonium salt is the polycondensation product of 3-methoxy-4-diazo-diphenyl amine sulfate and 4,4'bis-methoxy methyl-diphenyl ether, precipitated a mesitylene sulfonate as taught in U.S. Pat. No. 3,849,392. The Scripset resins are modified styrene/maleic anhydride copolymers, available from Monsanto. The pigments are introduced as a dispersion of methyl ethyl ketone, Scripset 540, and the appropriate pigment. The photosensitive solution is coated and then dried on Melinex 516, which is a high clarity polyethylene terephthalate film with a slip treatment on both sides. The adhesive solution is coated and dried to a solid areal density of 10–12 g/m$^2$ on top of the photosensitive layers. The formulation for the adhesive solution is:

| n-butyl acetate | 78.00 |
|---|---|
| Resoflex R-296 | 1.00 |
| Mowilith 30 | 21.00 |

Resoflex R-296 is a polymeric plasticizer, available from Cambridge Industries. Mowilith 30 is a polyvinyl acetate, available from Hoechst AG.

The yellow photosensitive element is laminated via the adhesive layer to the temporary element which is 3 mil thick Melinex 516. Lamination occurs by introducing the two materials into the nip of a pair of laminating rollers under suitable pressure at 75° C. After lamination, the substrate base of the yellow element is peeled away by merely employing manual peeling forces. The affinity of the adhesive to the temporary support is greater than the affinity of the photosensitive layer to the substrate.

The photosensitive layer is imagewise exposed to actinic light with emulsion-to-emulsion contact to a conventional negative flat for the yellow printer. Filtering the incident light is not necessary if the material behind the temporary support is non-reflective in the actinic region of the spectrum.

The exposed photosensitive layer is then developed by dissolving away the non-exposed areas. A suitable developer consists of:

| | |
|---|---|
| water | 89.264 |
| monosodium phosphate | 0.269 |
| trisodium phosphate | 2.230 |
| sodium tetradecyl sulfate | 8.237 |

The exposed yellow is immersed for 15 seconds in the developer at 27° C. with gentle pad rubbing on the photosensitive side. The adhesive layer is not effected by the developer. After development, the imaged material is rinsed and then dried with warm air.

The magenta element is then laminated as before with the yellow element onto the imaged, yellow side of the composite. The substrate of the magenta element is then removed as was done with the yellow element. The magenta photosensitive layer is then exposed in register through the negative flat of the magenta printer. The exposed magenta is then processed as was done with the yellow element.

The magenta is followed in a like manner by cyan and then by black to give a four color image on the temporary support.

The protective element consists of an adhesive layer on 3 mil thick Melinex 505, which is a high clarity polyethylene terephthalate film with an adhesion treatment on both sides. It is made by coating and drying the above-mentioned adhesive solution on the 505 film to a solid areal density of 10-12 g/m². The protective element is directly laminated as before to the four color image via the adhesive layer of the protective element. The temporary support is manually peeled away. The affinity of the adhesive to the Melinex 505 is greater than the affinity of the adhesive to the Melinex 516. The four color composite is then laminated to Mead 2S (70) paper.

EXAMPLE 2

The same photosensitive, transferable elements as in Example 1 are used. The temporary element for Example 2 is made by coating the Mowilith 30 adhesive solution of Example 1 onto 3 mil thick Melinex 516 to a solid areal density of 5-7 g/m². The cyan photosensitive element is laminated as mentioned above to the temporary element with the adhesive layer of the colored element in direct contact with the adhesive layer on the temporary support. The additional adhesive layer on the temporary support gives excellent transfer of the cyan photosensitive layer to the temporary support after peeling off the substrate of the cyan element.

The cyan photosensitive layer is then exposed and processed as mentioned above.

The yellow photosensitive element is laminated as before onto the imaged, cyan side of the composite. The substrate of the yellow element is then removed as before. The yellow photosensitive layer is exposed and processed as mentioned above.

The yellow is followed in a like manner by magenta and then by black to give a four color image on the temporary support.

The protective element is similar to that described in Example 1. It is made by coating and drying the following adhesive solution on 3 mil thick Melinex 505 to a solid areal density of 6-8 g/m².

| | |
|---|---|
| n-butyl acetate | 64.00 |
| Mowilith 30 | 10.00 |
| Resoflex R-296 | 1.00 |

-continued

| | |
|---|---|
| UCAR VYNC | 25.00 |

UCAR VYNC is a polyvinylchloride/acetate, hydroxyl-modified terpolymer, available from Union Carbide. The protective support is directly laminated to the four color image via the adhesive layer of the protective element. The clear temporary support is manually peeled away. The adhesive layer of the temporary element stays with the four color composite. The composite is then laminated to Mead 2S (70) paper.

EXAMPLE 3

The photosensitive elements are made like in Example 1 but the formulations for the photosensitive solutions are:

| | Cyan | Yellow | Magenta | Black |
|---|---|---|---|---|
| methyl ethyl ketone | 23.07 | 33.78 | 33.00 | 31.15 |
| gamma-butyrolactone | 8.52 | 6.01 | 6.35 | 8.41 |
| propylene glycol monomethyl ether | 43.94 | 39.81 | 39.66 | 39.54 |
| diacetone alcohol | 17.79 | 16.89 | 16.50 | 15.58 |
| Scripset 540 | 3.16 | 0.68 | 0.66 | |
| polyvinyl acetal/acetate/alcohol | 1.06 | 0.74 | 2.08 | 1.03 |
| Carboset XL27 | | | | 1.56 |
| polymeric diazonium salt | 1.23 | 1.35 | 0.99 | 1.87 |
| phthalo blue pigment | 1.14 | | 0.02 | |
| yellow pigment | | 0.74 | 0.05 | |
| rubine pigment | | | 0.69 | |
| black pigment | | | | 0.86 |
| optical density | 1.1 | 0.9 | 1.2 | 1.5 |

The polyvinyl acetal/acetate/alcohol is made according to Example 1 in U.S. patent application Ser. No. 762,089 filed Aug. 2, 1985. Carboset XL27 is an acrylic resin, available form BF Goodrich. The pigments are introduced as a dispersion of gammabutryolactone, propylene glycol monomethyl ether, polyvinyl acetal/acetate/alcohol, and the appropriate pigment. The Mowilith 30 adhesive solution mentioned in Example 1 is used to overcoat the photosensitive layers.

The yellow photosensitive element is laminated via the adhesive layer to the temporary element described in Example 2, which consists of an adhesive layer on a film support. The photosensitive layer is imagewise exposed to actinic light through the negative flat for the yellow printer and through the carrier base of the yellow element. Exposure through the base causes additional light scattering with resulting increase in image size. After the exposure, the substrate of the yellow element is peeled off. The exposed yellow is then processed as described above.

The magenta element is then laminated as before onto the imaged, yellow side of the composite. The magenta photosensitive layer is then exposed. The substrate of the magenta element is then peeled off. The exposed magenta layer is then processed.

The magenta is followed in a like manner by cyan and then black to give a four color image on the temporary element.

The protective element consists of an antiblocking layer in direct contact with a base with an adhesive layer on top of the antiblocking layer. The formulation for the antiblocking solution is:

| | |
|---|---|
| methyl cellosolve | 39.00 |
| methyl ethyl ketone | 39.00 |
| gamma butyrolactone | 10.00 |
| Scripset 540 | 10.00 |
| Carboset 525 | 2.00 |

Carboset 525 is an acrylic resin, available from BF Goodrich. The antiblocking solution is coated to an areal density of 3 g/m$^2$ onto a 3 mil thick Melinex 377, which is a filled polyester film with a matte surface. The formulation for the adhesive solution is:

| | |
|---|---|
| n-butyl acetate | 50.00 |
| UCAR VYNC | 50.00 |

The adhesive solution is coated to an areal density of 8-10 g/m$^2$ onto the antiblocking layer.

The protective element is directly laminated as before to the four color image via the adhesive layer of the protective element. The film support of the temporary element is gently peeled away from the four color composite. The four color composite is then laminated to Champion Kromekote 1S paper. The final step is the removal of the matte film base of the protective element by peeling off the matte base from the four color composite on the paper. The antiblocking layer with its adhesive remains with the four color image and protects it.

EXAMPLE 4

The photosensitive elements are made like in Example 1 but the formulations for the photosensitive solutions are:

| | Cyan | Yellow | Magenta | Black |
|---|---|---|---|---|
| methyl ethyl ketone | 35.52 | 34.45 | 24.23 | 38.62 |
| gamma-butyrolactone | 22.60 | 11.15 | 24.04 | 5.74 |
| propylene glycol monomethyl ether | 34.76 | 35.21 | 44.94 | 48.34 |
| diacetone alcohol | | 11.74 | | |
| Scripset 540 | 1.60 | 2.01 | 2.15 | 2.39 |
| SMA 2625 | 1.74 | 1.17 | | 0.60 |
| Butvar B-90 | 0.58 | 0.59 | 0.67 | 0.30 |
| naphthoquinone diazide | 2.09 | 2.58 | 2.81 | 2.72 |
| phthalo blue pigment | 1.11 | | | |
| yellow pigment | | 1.08 | | |
| rubine pigment | | | 1.15 | |
| black pigment | | | | 1.29 |
| optical density | 1.2 | 1.0 | 1.4 | 1.6 |

SMA is a styrene/maleic anhydride copolymer, available from ARCO. Butvar B-90 is a polyvinyl butyral resin, available from Monsanto. The naphthoquinone diazide is the ester of bis-(3-benzoyl-4,5,6-trihydroxy phenyl)-methane and 2-diazo-1-naphthol-5-sulfonic acid as taught in U.S. Pat. No. 4,407,426. The pigments are introduced as a dispersion of methyl ethyl ketone, Scripset 540, and the appropriate pigment. The Mowilith 30 adhesive solution mentioned in Example 1 was used to overcoat the photosensitive layers.

The yellow photosensitive element is laminated as before via the adhesive layers to the temporary element described in Example 2, which consists of an adhesive layer on a film support. After lamination at elevated temperature, the substrate of the yellow element is peeled away. The yellow photosensitive layer is imagewise exposed to actinic light with emulsion-to-emulsion contact to a conventional positive flat for the yellow printer. The exposed photosensitive layer is then developed by dissolving away the exposed areas. The yellow, exposed layer is immersed for 15 minutes into Example 1 developer at 23° C. and then gently rubbed for 45 minutes with a pad soak with the developer. After development, the imaged material is rinsed, squeegeed, and air dried.

The magenta element is then laminated as before onto the imaged, yellow side of the composite. The substrate of the magenta element is then removed as before. The magenta photosensitive layer is then exposed in register through the positive flat of the magenta printer. The exposed magenta is then processed as was done with the yellow photosensitive layer.

The magenta is followed in a like manner by cyan and then by black to give a four color image on the temporary element.

The protective element is similar to that described in Example 3. It consists of an antiblocking layer in direct contact with a base with an adhesive layer on top of the antiblocking layer. The formulation for the antiblocking solution is:

| | |
|---|---|
| methyl cellosolve | 39.00 |
| methyl ethyl ketone | 39.00 |
| gamma-butyrolactone | 10.00 |
| Scripset 540 | 9.90 |
| Carboset 525 | 2.00 |
| Formvar 12/85 | 0.10 |

Formvar 12/85 is used to increase the affinity of the antiblocking layer to the base of the protective support. It is a polyvinyl formal resin, available from Monsanto. The antiblocking solution is coated to an areal density of 2 g/m$^2$ onto a 3 mil thick Melinex 516. The formulation for the adhesive solution is:

| | |
|---|---|
| n-butyl acetate | 34.00 |
| methyl cellosolve | 30.00 |
| Mowilith 30 | 20.00 |
| Resoflex R-296 | 1.00 |

The adhesive solution is coated to an areal density of 15 g/m$^2$ onto the antiblocking layer.

The protective element is directly laminated as before to the four color image via the adhesive layer of the protective element. The film support of the temporary element is peeled away from the four color composite. The four color composite is then laminated to Champion Kromekote 1S. The final step is the removal of the matte film base of the protective element by peeling off the smooth base from the four color composite on the paper.

EXAMPLE 5

A temporary element is made by coating an adhesive solution onto a temporary support and then drying to an areal density of 6 g/m$^2$. The formulation for the adhesive solution is:

| | |
|---|---|
| n-butyl acetate | 76.00 |
| Mowilith 251 | 24.00 |

The adhesive layer is then overcoated with an antiblocking solution which is dried to an areal density of 3 g/m². The formulation for the antiblocking solution is:

| tetrahydrofuran | 45.00 |
|---|---|
| methyl ethyl ketone | 45.00 |
| Scripset 540 | 6.00 |
| polyvinyl acetal/acetate/alcohol | 4.00 |

The cyan photosensitive element of Example 3 is laminated at 70° C. to the antiblocking side of the temporary element. The antiblocking layer prevents the adhesive of the cyan element from sticking to the temporary element at room temperature before lamination.

After lamination, the substrate of the cyan element is peeled off. The photosensitive layer is then exposed to actinic light through a projected, negative image. It is then processed as described in Example 1.

Other colored elements can follow in a like manner.

The protective element of Example 3 was then laminated as before to the imaged material via the adhesive layer of the protective element. The film support of the temporary element is peeled away from the imaged material. The adhesive and antiblocking layers of the temporary element remain with the imaged material. The imaged material is then laminated to Champion Kromekote 1S paper. The final step is the removal of the matte film base of the protective element by peeling off the matte base from the cyan composite. The antiblocking and adhesive layers of the protective element remain with the imaged material.

EXAMPLE 6

The photosensitive elements are made according to Example 3. The yellow photosensitive element is laminated via the adhesive layer to the temporary element. The temporary element consists of 7 mil thick Melinex XRB which is a blue transparent polyester film. The film has minimal light absorption in the actinic region (i.e., <0.3 absorbance units). The film is visually distinguishable from the carrier substrate of the colored elements. The substrate of the yellow element is peeled away by merely employing manual peeling forces. The affinity of the adhesive from the photosensitive element to the temporary element is greater than the affinity of the photosensitive layer to its substrate.

The yellow photosensitive layer is exposed to the radiant flux from a medium-pressure mercury lamp. No filters, such as a Kokomo filter, are used. The dot-gain can be adjusted by properly selecting the amount of reflected actinic light coming from the background. Minimal dot-gain is achieved with the least amount of reflection. The exposed yellow is immersed for 15 sec in the developer at 27° C. with gentle pad rubbing on the photosensitive side. The adhesive layer and temporary support are not affected by the developer. After development, the imaged material is rinsed and then dried with warm air.

The magenta element is then laminated as before onto the imaged, yellow side of the composite. The magenta photosensitive layer is then exposed. The substrate of the magenta element is then peeled off. The exposed magenta layer is then processed as described above.

The magenta is followed in a like manner by cyan and then black to give a four color image on the temporary element.

The protective element consists of an antiblocking layer in direct contact with a base with an adhesive layer on top of the antiblocking layer. The formulation for the antiblocking solution is:

| methyl cellosolve | 35.71 |
|---|---|
| methyl ethyl ketone | 35.71 |
| gamma butyrolactone | 23.81 |
| Scripset 540 | 2.38 |
| polyvinyl acetal/acetate/alcohol | 2.38 |
| Formvar 12/85 | 0.01 |

The polyvinyl acetal/acetate/alcohol is made according to example 1 in U.S. patent application Ser. No. 762,089 filed Aug. 2, 1985. Scripset 540 is a modified styrene/maleic anhydride copolymer, available from Monsanto. The Formvar 17/85 is used to control the affinity of the antiblocking layer to its support. The antiblocking solution is coated to an areal density of 3 g/m² onto a 3 mil thick Melinex 377, which is a filled polyester film with a matte surface. The formulation for the adhesive solution is:

| n-butyl acetate | 68.00 |
|---|---|
| amyl acetate | 10.00 |
| Mowilith 30 | 21.00 |
| Resoflex R-296 | 1.00 |

The adhesive solution is coated to an areal density of 29 g/m² onto the antiblocking layer.

The protective element is directly laminated as before to the four color image via the adhesive layer of the protective element. The blue temporary support is peeled away from the four color composite. The affinity of the antiblocking layer to its support is greater then the affinity of the color coat adhesive to the blue temporary support. The four color composite is then laminated to Champion Kromekote 1S paper. The final step is the removal of the matte base of the protective element by manually peeling it off from the four color composite on the paper. The antiblocking layer with its adhesive remains with the four color image and protects it.

What is claimed is:

1. A method for forming a colored image on a permanent support which comprises:
   A) providing a photosensitive element which comprises, in order:
      a substrate having a release surface; and a photosensitive member directly attached to said release surface, which member comprises
      a colored, adherent, photosensitive layer, which layer comprises light sensitive, positive working or negative working compound; a resinous binder and at least one colorant; and
   B) providing a temporary element, which comprises a dimensionally heat stable support having a release surface;
   C) either
      i) laminating said photosensitive member with heat and pressure to the release surface of the temporary element; and removing said substrate from the photosensitive element by the application of peeling forces thus transferring the photosensitive member to the release surface of the temporary element; and imagewise exposing said photosensitive layer to actinic radiation to thereby form image and non-image portions of the photosensitive member on the release surface of the temporary element; or ii) imagewise exposing said photosensitive layer to actinic radiation; and laminating said photosensitive member with heat and pressure to the release surface of the temporary element; and removing said substrate from the photosensitive element by the application of peeling forces thus transferring the image and non-image portions of the photosensitive member to the release surface of the temporary element; or iii) laminating said photosensitive member with heat and pressure to the release surface of the temporary element; and imagewise exposing said photosensitive layer to actinic radiation; and removing said substrate from the photosensitive element by the application of peeling forces, thus transferring the image and nonimage portions of the photosensitive member to the release surface of the temporary element; and thereafter D) removing the nonimage areas of said photosensitive layer with a liquid developer, thereby providing a colored image on the release surface of the temporary element; and E) proving a protective element, which element comprises a dimensionally heat stable base on which base is applied an adhesive; and F) laminating said protective element to said colored image via said adhesive; and G) removing the support of the said temporary element thereby transferring said image to said protective element and uncovering at least a portion of an adhesive layer; and laminating the protective element via said uncovered adhesive layer to a permanent support.

2. The method of claim 1 wherein said support, substrate and base, comprise one or more materials selected from the group consisting of organic polymer, paper, and paper laminates.

3. The method of claim 1 wherein said light sensitive compound comprises one or more components selected from the group consisting of diazides, diazonium salts, and photopolymerizable or photocrosslinkable compositions.

4. The method of claim 1 wherein said resin binder comprises one or more components selected from the group consisting of polyvinyl butyral, styrene-maleic anhydride copolymer half esters, and polyvinyl acetal/acetate/alcohol copolymers.

5. The method of claim 1 wherein said adhesive comprise a polyvinyl acetates and copolymers of polyvinyl acetate and polyvinyl chloride.

6. The method of claim 1 wherein said permeant support comprises paper, coated paper, or metals.

7. The method of claim 1 wherein applied to said support of said temporary element is a colorless adhesive, which adhesive layer has a softening point in the range of from about 60° C. to about 180° C.

8. The method of claim 7 wherein on the colorless adhesive layer of the temporary element is applied an antiblocking layer; said antiblocking layer comprising one or more organic polymers or copolymers, which antiblocking layer does not cohesively block at about 50° C. or less.

9. The method of claim 8 wherein said antiblocking layer comprises one or more compounds selected from the group consisting of styrene-maleic anhydride copolymers, polyvinyl acetals, polyvinyl acrylates, and polyvinyl acetate/polyvinyl chloride copolymers.

10. The method of claim 1 wherein said laminations are conducted at a temperature of from about 60° C. to about 90° C.

11. The method of claim 1 where said support, substrate and base comprise one or more materials selected from the group consisting of organic polymer, paper and paper laminates; and wherein said permanent support comprises paper, coated paper, or metals; and wherein said light sensitive compound comprises one or more components selected from the group consisting of diazides, diazonium salts, and photopolymerizable or photocrosslinkable compositions; and wherein said resinous binder comprises one or more components selected from the group consisting of polyvinyl butyral, styrenemaleic anhydride copolymer half esters, and polyvinyl acetal/acetate/alcohol copolymers; and wherein said adhesive comprises a polyvinyl acetate and copolymers of polyvinyl acetate and polyvinyl chloride;

and wherein said laminations are conducted at a temperature of from about 60° C. to about 90° C.

12. The method of claim 1 further comprising a colorless adhesive layer adhered to said colored photosensitive layer, which adhesive layer has a softening point in the range of from about 60° C. to about 180° C.

13. The method of claim 12 further comprising a noncolored photosensitive or nonphotosensitive barrier layer coating between said colored photosensitive layer and said adhesive layer, said barrier layer being effective to prevent the intermingling of said colored photosensitive and adhesive layer.

14. The method of claim 1 further comprising repeating steps A-D prior to conducting step C by laminating another photosensitive member having a different colorant to the previous imaged layer.

15. The method of claim 1 wherein said protective element further comprises a release layer between the base and the adhesive layer thereon.

16. The method of claim 15 wherein said protractive element further comprises an antiblocking layer between the release layer and the adhesive layer thereon.

17. The method of claim 1 further comprising the subsequent step for removing the dimensionally heat stable base of the protective element thereby transferring the colored image onto said permanent support.

18. A method for forming a colored image which comprises:

A) providing a photosensitive element which comprises, in order:
a substrate having a release surface; and a photosensitive member directly attached to said release surface, which member comprises
i) a colored, adherent, photosensitive layer, which layer comprises a light sensitive, positive working or negative working compound; a resinous binder and at least one colorant; and
ii) a first colorless adhesive layer adhered to on said colored photosensitive layer, which adhesive layer has a softening point in the range of from about 60° C. to about 180° C.; and
iii) a noncolored photosensitive or nonphotosensitive barrier layer coating between said colored photosensitive layer and said first adhesive layer said barrier layer being effective to prevent the intermingling of said colored photosensitive and first adhesive layers; and thereafter B) providing a temporary element, which comprises a dimensionally heat stable support having a release surface on which release surface is applied a colorless adhesive, which adhesive layer has a softening point in the range of from about 60° C. to about 180° C., on which adhesive is applied an antiblocking layer; said antiblocking layer comprising one or more organic polymers or copolymers, which antiblocking layer does not cohesively block at about 50° C. or less;

C) either
  i) laminating said photosensitive member with heat and pressure to the antiblocking layer of the temporary element; and removing said substrate from the photosensitive element by the application of peeling forces thus transferring the photosensitive member to the antiblocking layer of the temporary element; and imagewise exposing said photosensitive layer to actinic radiation to thereby form image and non-image portions of the photosensitive member on the antiblocking layer of the temporary element; or
  ii) imagewise exposing said photosensitive layer to actinic radiation; and laminating said photosensitive member with heat and pressure to the antiblocking layer of the temporary element; and removing said substrate from the photosensitive element by the application of peeling forces thus transferring the image and non-image portions of the photosensitive member to the antiblocking layer of the temporary element; or
  iii) laminating said photosensitive member with heat and pressure to the antiblocking layer of the temporary element; and imagewise exposing said photosensitive layer to actinic radiation; and removing said substrate from the photosensitive element by the application of peeling forces, thus transferring the image and nonimage portions of the photosensitive member to the antiblocking layer of the temporary element; and thereafter D) removing the nonimage areas of said photosensitive layer with a liquid developer, which removing is conducted at a temperature at which said adhesive layers are substantially nontacky, thereby providing a colored image on the antiblocking layer of the temporary element; and E) repeating steps A-D by laminating another photosensitive member having a different colorant to the previous imaged antiblocking layer; and providing a protective element, which element comprises a dimensionally heat stable base having a release layer on which release layer is applied a second adhesive and another antiblocking layer between said base and said second adhesive; and F) laminating said protective element to said colored image via said second adhesive; and G) removing the support of the said temporary element thereby uncovering an adhesive layer; and laminating the protective element via said uncovered adhesive layer to a permanent support.

19. The method of claim 18 further comprising the subsequent step of removing the dimensionally heat stable base of the protective element thereby transferring the colored image unto said permenant support.

20. The method of claim 18 wherein said support, substrate and base comprise one or more materials selected from the group consisting of organic polymer, paper and paper laminates; and wherein said permanent support comprises paper, coated paper, or a metal; and
  wherein said light sensitive compound comprises one or more components selected from the group consisting of diazides, diazonium salts, and photopolymerizable or photocrosslinkable compositions; and
  wherein said resinous binder comprises one or more components selected from the group consisting of polyvinyl butyral, styrenemaleic anhydride copolymer half esters, and polyvinyl acetal-/acetate/alcohol copolymers; and
  wherein said adhesive comprises a polyvinyl acetate or copolymer of polyvinyl acetate and polyvinyl chloride; and
  wherein said antiblocking layers comprise one or more compounds selected from the group consisting of styrenemaleic anhydride copolymers, polyvinyl acetals, polyvinyl acrylates, and polyvinyl acetate/polyvinyl chloride copolymers; and wherein said laminations are conducted at a temperature of from about 60° C. to about 90° C.

* * * * *